(12) United States Patent
Kitani et al.

(10) Patent No.: US 10,842,059 B2
(45) Date of Patent: Nov. 17, 2020

(54) COMPONENT SUPPLY DEVICE

(71) Applicant: Panasonic Intellectual Property Management Co., Ltd., Osaka (JP)

(72) Inventors: Minoru Kitani, Fukuoka (JP); Motohiro Higuchi, Nara (JP); Shigeru Matsukawa, Osaka (JP); Kei Tsunemasa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 154 days.

(21) Appl. No.: 16/223,817

(22) Filed: Dec. 18, 2018

(65) Prior Publication Data

US 2019/0200493 A1    Jun. 27, 2019

(30) Foreign Application Priority Data

Dec. 26, 2017 (JP) .................................. 2017-249762

(51) Int. Cl.
*H05K 13/04* (2006.01)

(52) U.S. Cl.
CPC ............................. *H05K 13/0419* (2018.08)

(58) Field of Classification Search
USPC ........................................................ 162/271
See application file for complete search history.

(56) References Cited

U.S. PATENT DOCUMENTS

| 3,976,237 | A  | * | 8/1976 | Bossons ................. B65H 23/24 |
| | | | | 226/97.3 |
| 6,246,860 | B1 | * | 6/2001 | Ohmichi ................. B65H 29/60 |
| | | | | 271/188 |
| 6,362,020 | B1 | * | 3/2002 | Shimoda ........... H01L 31/03921 |
| | | | | 257/E31.042 |
| 6,908,242 | B2 | * | 6/2005 | Oshima .................. B65H 23/34 |
| | | | | 162/271 |
| 2019/0200492 | A1 | * | 6/2019 | Kitani .................... B65H 20/22 |

FOREIGN PATENT DOCUMENTS

JP    2010-153439    7/2010

* cited by examiner

*Primary Examiner* — Mark Halpern
(74) *Attorney, Agent, or Firm* — Pearne & Gordon LLP

(57) ABSTRACT

A component supply device that supplies a component stored in a carrier tape to a component mounting apparatus, the component supply device includes a curl corrector that corrects curl of an empty tape which is a carrier tape from which the component is picked up by the component mounting apparatus.

5 Claims, 15 Drawing Sheets

COMPONENT SUPPLY DEVICE

BACKGROUND

1. Technical Field

The present disclosure relates to a component supply device that supplies a component stored in a carrier tape to a component mounting apparatus.

2. Description of the Related Art

In the related art, there is known a configuration in which a component supply device (tape feeder) for supplying a component stored in a carrier tape wound around a reel is installed on an upper portion of a carriage to be fitted to a component mounting apparatus, is known (for example, Japanese Patent Unexamined Publication No. 2010-153439). In Japanese Patent Unexamined Publication No. 2010-153439, a used carrier tape (empty tape) discharged from the tape feeder, from which a component is picked up, is fed to a carrier tape storage box disposed below the tape feeder along a tape discharge passage included in the carriage to be collected.

SUMMARY

A component supply device of the disclosure that supplies a component stored in a carrier tape to a component mounting apparatus, the component supply device including a curl corrector that corrects curl of an empty tape which is the carrier tape from which the component is picked up by the component mounting apparatus. According to the disclosure, it is possible to smoothly collect a carrier tape having a large curl.

DETAILED DESCRIPTIONS

In the technique of the related art including Japanese Patent Unexamined Publication No. 2010-153439, in a case where curl caused by winding the carrier tape formed of paper or the like on the reel is large, there is a problem that a curved empty tape is caught in the tape discharge passage and the empty tape cannot be smoothly collected.

Therefore, an object of the disclosure is to provide a component supply device which can smoothly collect even a carrier tape having large curl.

Figure 1:
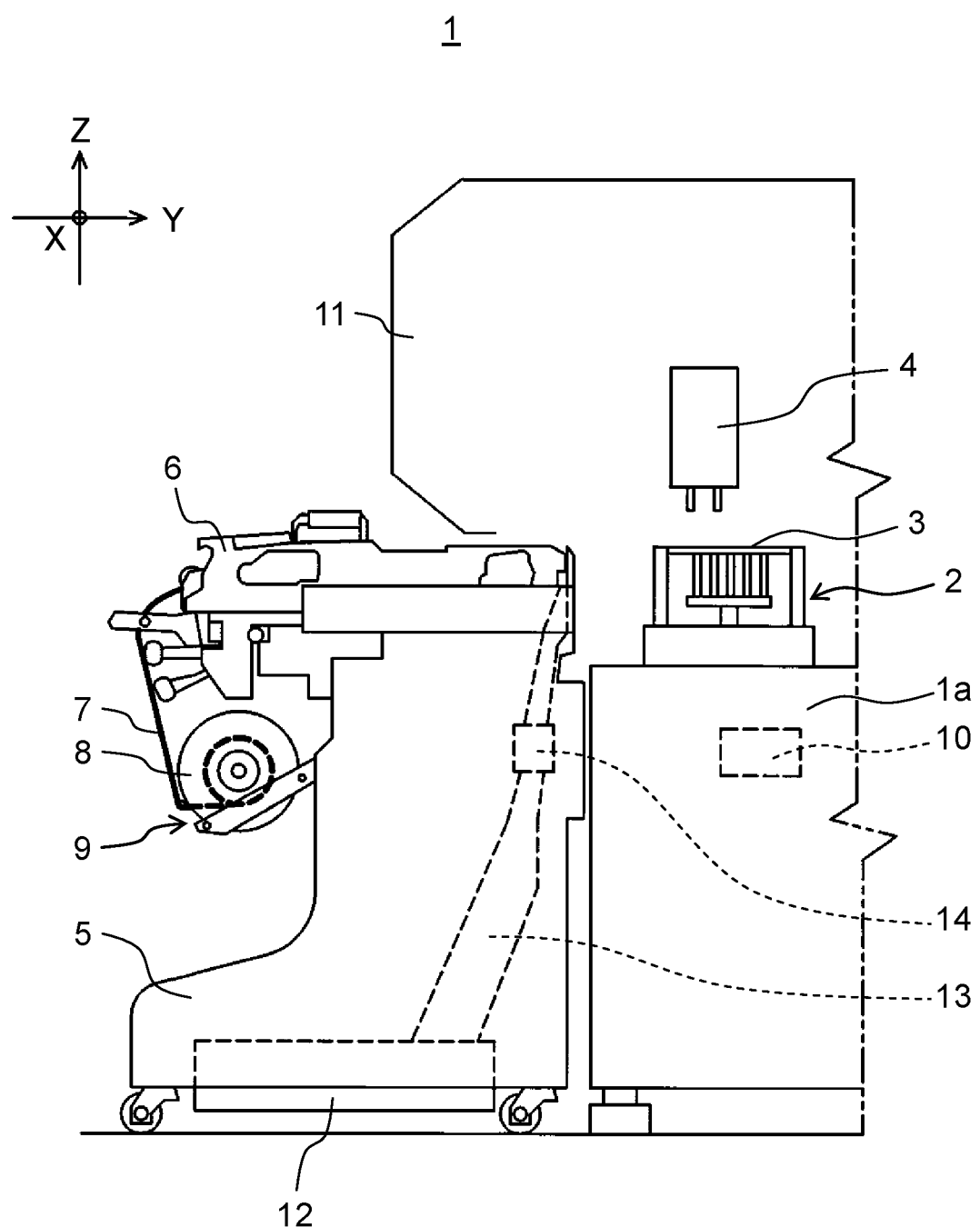
FIG. 1 is an explanatory view of a configuration of a component mounting apparatus of an embodiment of the disclosure.

Hereinafter, an embodiment of the disclosure will be described in detail with reference to the drawings. Configurations, shapes, and the like described below are examples for explanation, and can be appropriately changed according to the specifications of a component mounting apparatus, a tape feeder, a carriage, and the like. In the following description, the same reference numerals are given to the corresponding elements in all drawings, and redundant explanations are omitted. In FIG. 1, an X direction (direction perpendicular to a paper surface in FIG. 1) in a board transport direction and a Y direction (rightward and leftward direction in FIG. 1) orthogonal to the board transport direction are illustrated as two axial directions orthogonal to each other in a horizontal plane. In addition, a Z direction (upward and downward direction in FIG. 1) orthogonal to the horizontal plane is illustrated as a height direction.

First, a configuration of component mounting apparatus 1 will be described with reference to FIG. 1. Component mounting apparatus 1 has a function of manufacturing a mounting board where a component is placed on a board. Board transport mechanism 2 provided on an upper surface of base 1a transports and positions board 3 in the X direction to hold board 3. Installing head 4 that is moved in the horizontal direction (X direction and Y direction) by a head moving mechanism (not illustrated) is disposed above board transport mechanism 2. A plurality of tape feeders 6 are fitted to an upper portion of carriage 5 coupled to base 1*a* on a side of board transport mechanism 2 side by side in the X direction.

Reel holder 9, which rotatably supports reel 8 on which carrier tape 7 for storing the component to be supplied to component mounting apparatus 1 is wound, is disposed below tape feeder 6 on a front side of carriage 5. Tape feeder 6 transports carrier tape 7 stored in reel 8 in a tape feeding direction to supply the component to a component pick-up position by installing head 4.

Component mounting apparatus 1 includes board transport mechanism 2, installing head 4, and installing controller 10 that controls the head moving mechanism. Installing controller 10 transmits a component supply command to tape feeder 6 to control installing head 4 and the head moving mechanism, so that tape feeder 6 picks up the component to be supplied to the component pick-up position by installing head 4 and component installing work for transferring and placing the component on an installing point of board 3 held by board transport mechanism 2 is executed. As described above, tape feeder 6 is the component supply device that supplies the component stored in carrier tape 7 to component mounting apparatus 1. Freely openable and closable body cover 11 for covering a movable mechanism such as installing head 4 is disposed above carriage 5, so that a worker does not touch the movable mechanism during the component installing work.

In FIG. 1, collection box 12 for collecting empty carrier tape 7 discharged from a rear of tape feeder 6, from which the component is picked up by installing head 4, is disposed at a lower portion of carriage 5. Discharge chute 13 for guiding empty carrier tape 7 discharged from tape feeder 6 to collection box 12 is disposed on a rear side of carriage 5. Cutter 14 for cutting empty carrier tape 7 with a predetermined length is disposed in discharge chute 13. Empty carrier tape 7 discharged from tape feeder 6 is cut by cutter 14 and is collected in collection box 12.

Next, a configuration and a function of tape feeder 6 will be described with reference to FIG. 2. Tape guideway 20 for guiding carrier tape 7 which is drawn out from reel 8 and captured in tape feeder 6 is provided on an inside of tape feeder 6. Tape guideway 20 communicates from insertion port 20*a* opened to an upstream side (left side in FIG. 2) in the tape feeding direction in tape feeder 6 to discharge port 20*b* opened to a downstream side (right side in FIG. 2) in the tape feeding direction. Component pick-up position P at which the component is picked up by installing head 4 is provided in the middle of tape guideway 20.

A plurality of carrier tapes 7 of which unit lots are stored in one reel 8 are supplied to tape feeders 6 sequentially inserted from insertion port 20*a* in a course of continuously executing the component installing work. Hereinafter, among two carrier tapes 7 which are introduced from insertion port 20*a* and fed in tandem with each other, carrier tape 7 which leads the other is referred to as leading tape 7*p* and carrier tape 7 which is fed after leading tape 7*p* is referred to as following tape 7*s* (see FIG. 4). That is, tape guideway 20 has insertion port 20*a* through which inserting leading tape 7*p* and following tape 7*s* can be inserted.

Figure 2:
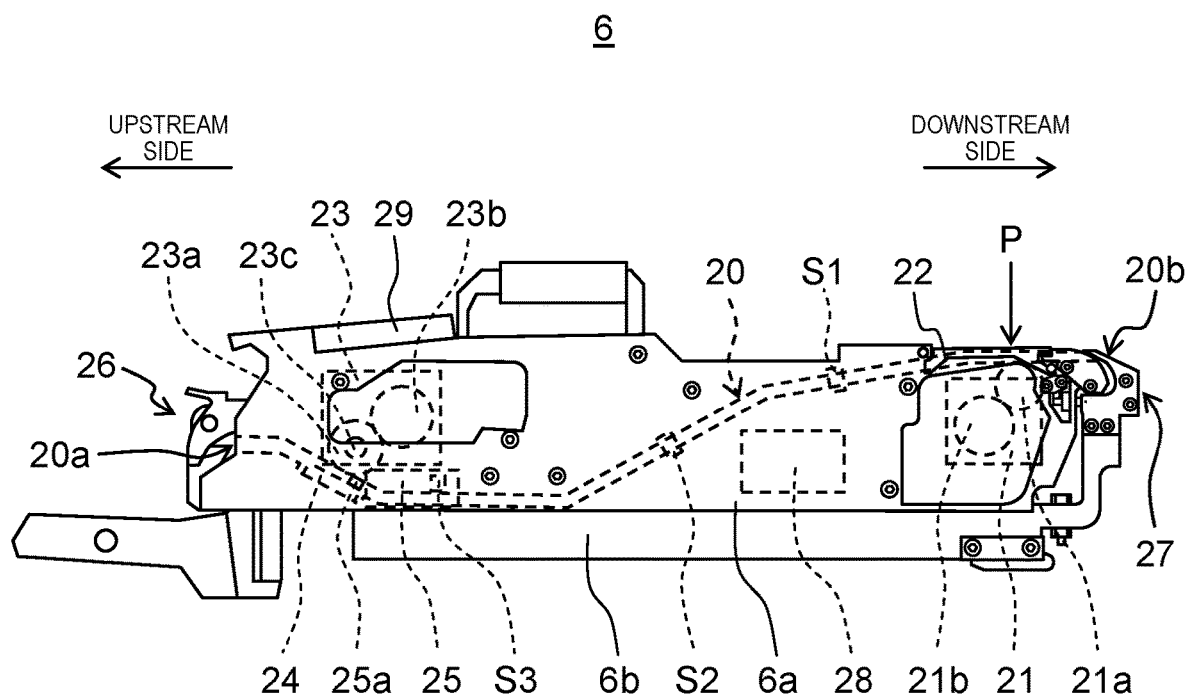
FIG. 2 is an explanatory view of the configuration of the component supply device of the embodiment of the disclosure.

In FIG. 2, first tape feed mechanism 21 for feeding leading tape 7*p* to component pick-up position P is provided on the downstream side in tape guideway 20. First tape feed mechanism 21 is configured to include first sprocket 21*a* engaging with leading tape 7*p* and first motor 21*b* driving first sprocket 21*a* to rotate. Tape cover 22 including a peeling blade for pressing leading tape 7*p* from above and exposing the component stored in leading tape 7*p* is installed above first tape feed mechanism 21. An opening is formed at a position corresponding to component pick-up position P of tape cover 22. When carrier tape 7 travels along a lower surface of tape cover 22 by sprocket 21*a*, the component is exposed by the peeling blade and the exposed component is transported to the opening formed on the downstream thereof, that is, component pick-up position P.

In FIG. 2, second tape feed mechanism 23 for feeding following tape 7*s* inserted from insertion port 20*a* to first tape feed mechanism 21 is provided on the upstream side in tape guideway 20. Second tape feed mechanism 23 is configured to include second sprocket 23*a* engaging with following tape 7*s* and second motor 23*b* driving second sprocket 23*a* to rotate. Encoder 23*c* is built in second sprocket 23*a* as a rotation detector. Tape pressing mechanism 24 and tape stopper mechanism 25 are disposed below second tape feed mechanism 23.

Following tape 7*s* inserted from insertion port 20*a* is pressed against second sprocket 23*a* by tape pressing mechanism 24 and engages with second sprocket 23*a*, so that the tape can be fed. Second sprocket 23*a* engages with following tape 7*s* to rotate, so that encoder 23*c* detects that following tape 7*s* engages with second sprocket 23*a*. Tape stopper mechanism 25 has a function of passing leading tape 7*p* to the downstream side without stopping and temporarily stopping a leading end portion of following tape 7*s* which is inserted by being superimposed on leading tape 7*p* by stopper member 25*a*.

In FIG. 2, following tape holder 26, which holds an uninserted portion of following tape 7*s* inserted from insertion port 20*a* in a state of being superimposed on leading tape 7*p*, which is not inserted from insertion port 20*a*, at a position spaced apart upward from the uninserted portion of leading tape 7*p*, is provided on the upstream side of insertion port 20*a*. Details of a configuration of following tape holder 26 will be described later. Curl corrector 27 for correcting curl of empty tape 7*e* while guiding empty carrier tape 7 (hereinafter, referred to as "empty tape 7*e*") discharged from discharge port 20*b*, from which the component is picked up, to lower discharge chute 13 is provided on the downstream side of discharge port 20*b*. Details of a configuration of curl corrector 27 will be described later.

In FIG. 2, first sensor 51 for detecting presence or absence of carrier tape 7 is disposed on the upstream side of first tape feed mechanism 21 in tape guideway 20. Similarly, second sensor S2 for detecting presence or absence of carrier tape 7 is disposed on the upstream side of first sensor 51 on the downstream side of second tape feed mechanism 23. Tape stopper mechanism 25 includes third sensor S3 for detecting that following tape 7*s* abuts against stopper member 25*a*.

Detection results by first sensor 51, second sensor S2, and third sensor S3 are transmitted to feeder controller 28 included in tape feeder 6. Attachment 6*b* is installed on a lower surface of base 6*a* of tape feeder 6. When tape feeder 6 is installed on carriage 5 via attachment 6*b*, feeder controller 28 is electrically connected to installing controller 10 via carriage 5.

Figure 3:
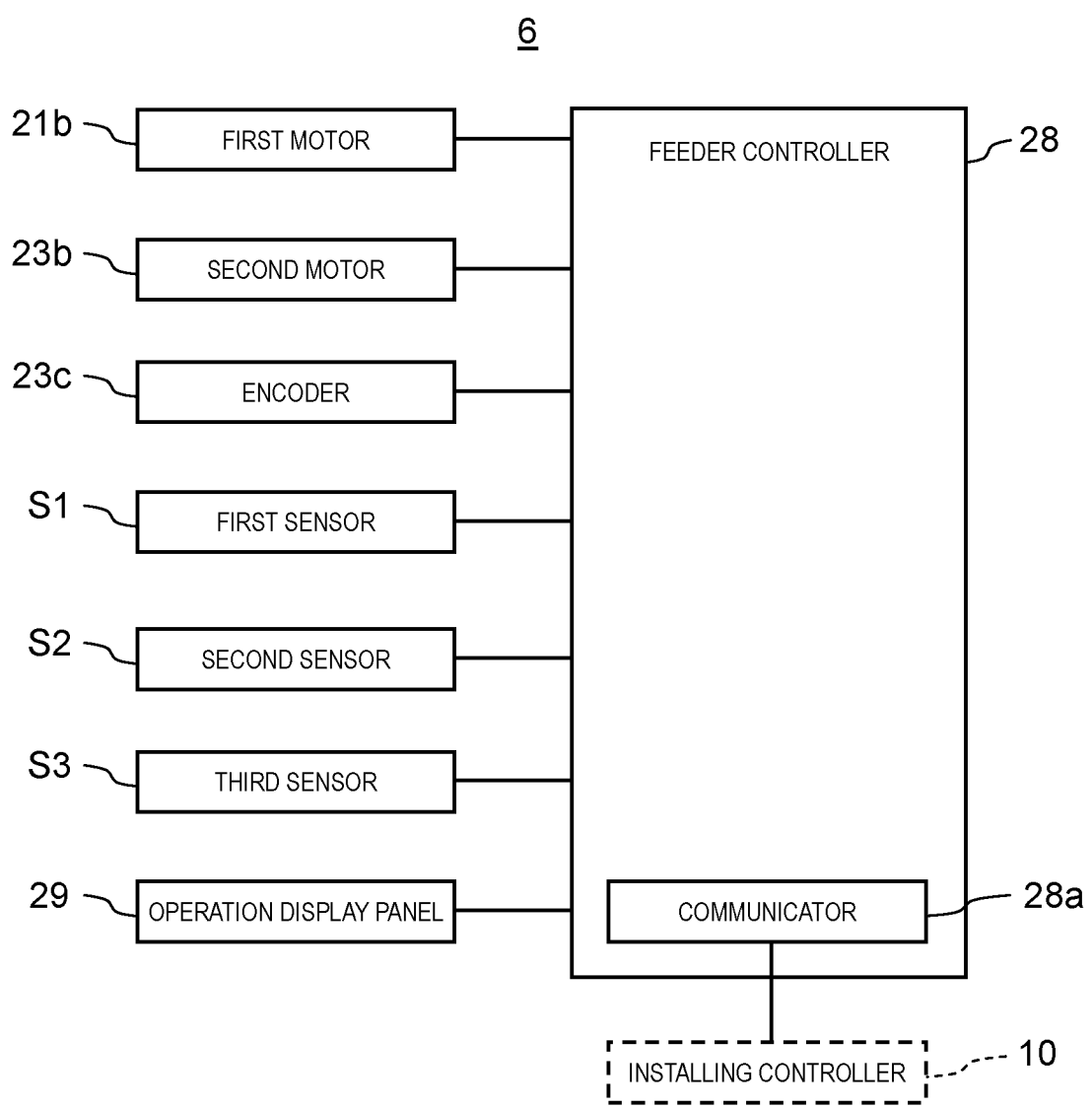
FIG. 3 is a block diagram illustrating a configuration of a control system of the component supply device of the embodiment of the disclosure.

In FIG. 2, operation display panel 29 connected to feeder controller 28 is disposed on an upper surface of tape feeder 6 on the upstream side (see also FIG. 3). A display such as an LED for notifying a worker of predetermined contents together with operation buttons for the operator to perform predetermined operation input is provided in operation display panel 29. The worker can check an operation state of tape feeder 6 and input an operation of a predetermined item by operation display panel 29.

Next, a configuration of a control system of tape feeder 6 will be described with reference to FIG. 3. Feeder controller 28 included in tape feeder 6 includes communicator 28a. Communicator 28a is a communication interface and exchanges signals and data with installing controller 10 included in component mounting apparatus 1. Feeder controller 28 controls first motor 21b and second motor 23b based on the detection results of encoder 23c, first sensor S1, second sensor S2, and third sensor S3 to execute a tape transport operation of leading tape 7p and following tape 7s in accordance with a predetermined control pattern.

Here, the tape transport operation in tape feeder 6 will be described with reference to FIG. 2. First, the worker inserts leading tape 7p from insertion port 20a in a state where carrier tape 7 is not supplied to tape feeder 6. When inserted leading tape 7p reaches second sprocket 23a, leading tape 7p engages with second sprocket 23a.

When encoder 23c detects that leading tape 7p engages with second sprocket 23a, feeder controller 28 drives second motor 23b to rotate and transports leading tape 7p to first tape feed mechanism 21. Moreover, when the worker operates operation display panel 29, feeder controller 28 may transport leading tape 7p to first tape feed mechanism 21. When leading tape 7p reaches first tape feed mechanism 21, feeder controller 28 puts second motor 23b in an idle mode, drives first motor 21b to rotate, and pitch-feeds leading tape 7p at a predetermined pitch.

In a case of replenishing following tape 7s in a state where the component is supplied from leading tape 7p, the worker inserts following tape 7s from insertion port 20a via following tape holder 26. When inserted following tape 7s reaches second sprocket 23a, following tape 7s engages with second sprocket 23a. When encoder 23c detects that following tape 7s engages with second sprocket 23a, feeder controller 28 drives second motor 23b to rotate and transports following tape 7s to the downstream side. When third sensor S3 detects that the leading end portion of following tape 7s transported to the downstream side abuts against stopper member 25a, feeder controller 28 stops driving of second motor 23b.

When the component is continuously supplied from leading tape 7p and a trailing end portion of leading tape 7p passes through tape stopper mechanism 25, tape stopper mechanism 25 releases the stop of following tape 7s by stopper member 25a. Next, when an end portion of leading tape 7p reaches second sensor S2, feeder controller 28 drives second motor 23b to rotate and transports following tape 7s until the leading end portion of following tape 7s reaches second sensor S2. Thereafter, feeder controller 28 transports following tape 7s to the downstream side according to the pitch-feeding of leading tape 7p until the trailing end portion of leading tape 7p reaches first sensor S1.

When the trailing end portion of leading tape 7p reaches first sensor S1, feeder controller 28 drives second motor 23b to rotate and transports following tape 7s until the leading end portion of following tape 7s reaches first sensor S1. When the component supply from leading tape 7p is completed and leading tape 7p passes through first tape feed mechanism 21, feeder controller 28 drives second motor 23b to rotate and transports following tape 7s to first tape feed mechanism 21. Thereafter, following tape 7s becomes leading tape 7p and the component supply is executed.

Figure 7:
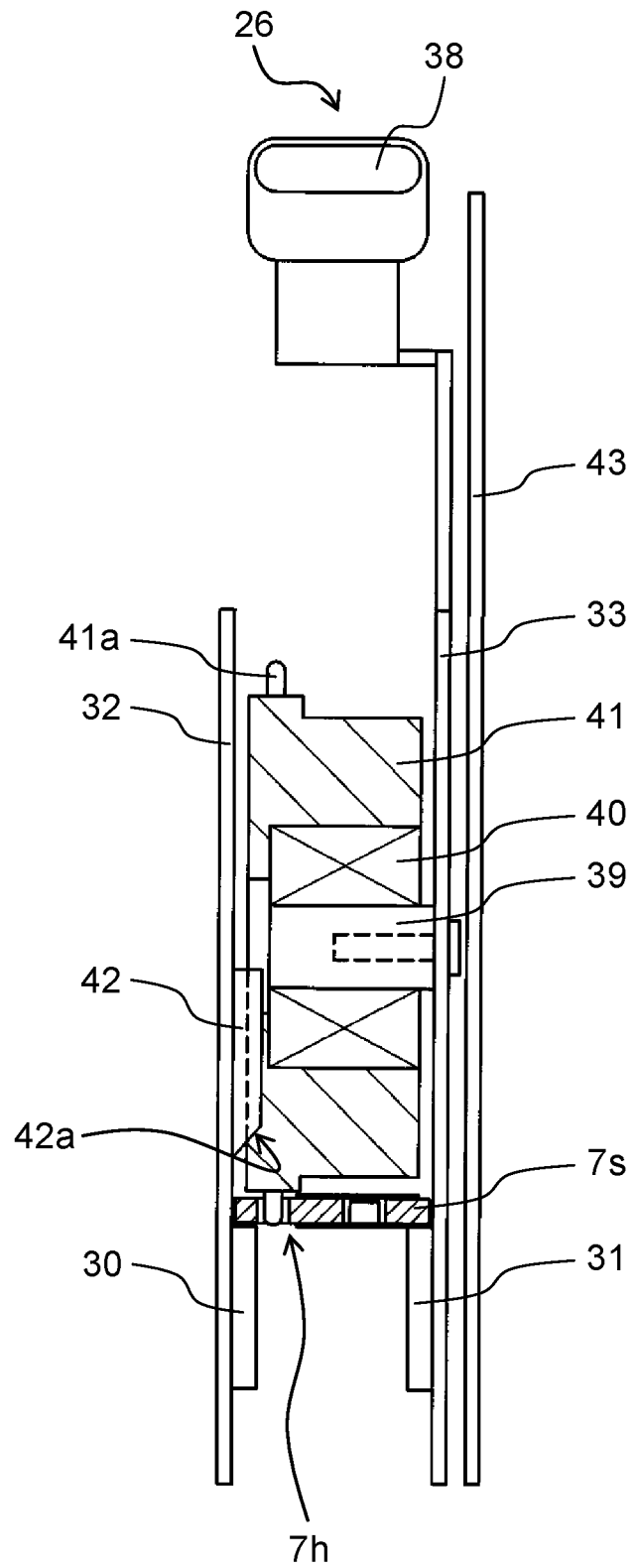
FIG. 7 is an explanatory view of the configuration of the following tape holder in the component supply device of the embodiment of the disclosure.
Figure 8:
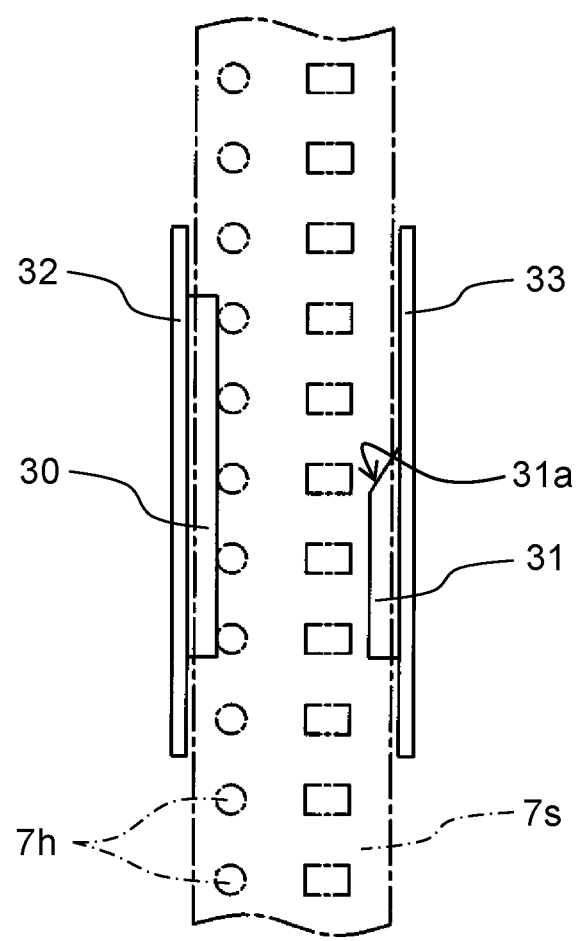
FIG. 8 is an explanatory view of the configuration of the following tape holder in the component supply device of the embodiment of the disclosure.

Next, a configuration of following tape holder 26 will be described with reference to FIGS. 4 to 8. In FIGS. 6 to 8, following tape holder 26 includes first supporter 30 that supports one side portion of following tape 7s in the width direction from below and second supporter 31 that supports the other side portion thereof from below. Hereinafter, for convenience, one side of following tape 7s in the width direction is referred to as a left side (left side in FIG. 7) and the other side is referred to as a right side (right side in FIG. 7).

In FIGS. 6 to 8, first supporter 30 is formed on a right side surface of plate member 32 having a plate shape which spreads in the tape feeding direction, and the upward and downward direction (Z direction). The right side surface of plate member 32 is a guide surface for guiding a left side surface of following tape 7s. Plate member 32 is fixed to base 6a (see FIG. 5) of tape feeder 6. Second supporter 31 is formed on a left side surface of movable member 33 having a plate shape which spreads in the tape feeding direction, and the upward and downward direction. The left side surface of movable member 33 is a guide surface for guiding the right side surface of following tape 7s.

Figure 5:
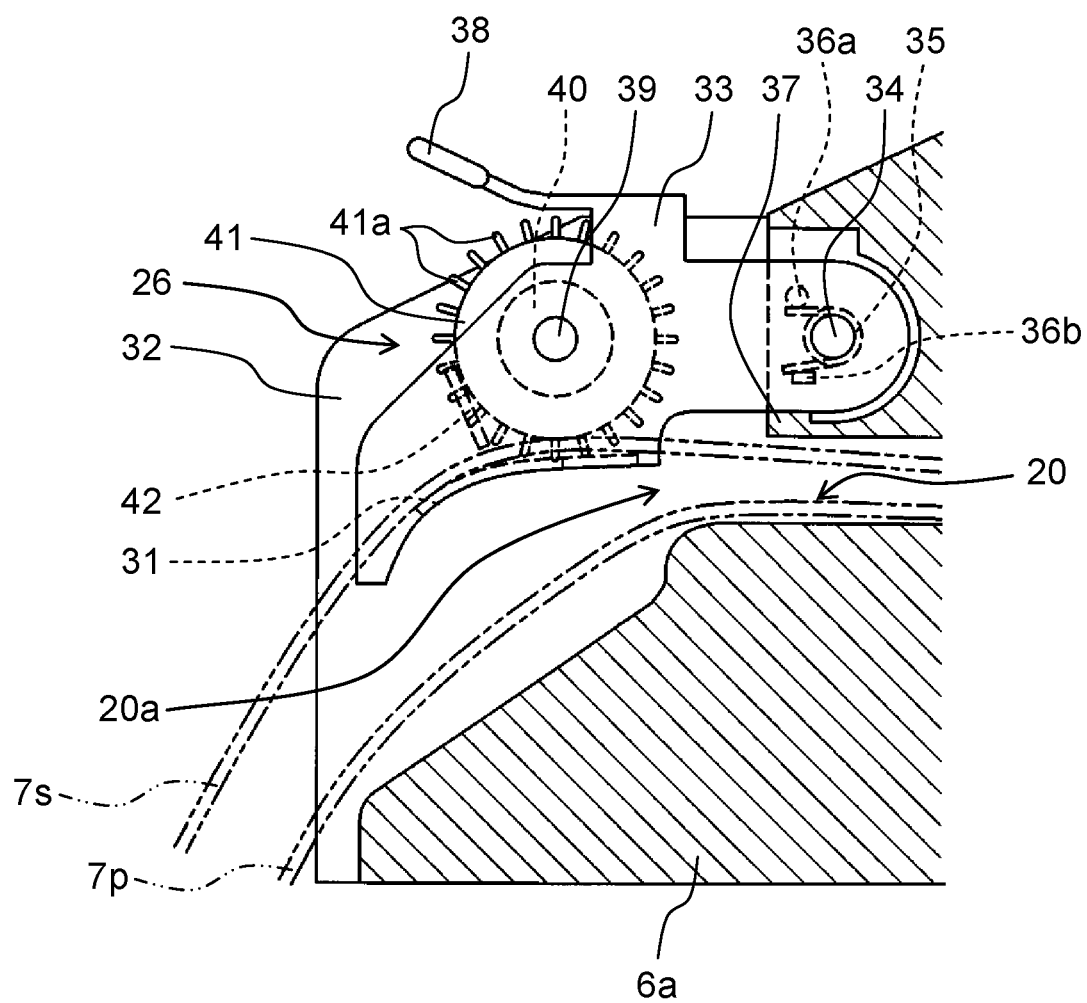
FIG. 5 is an explanatory view of the configuration of the following tape holder in the component supply device of the embodiment of the disclosure.
Figure 6:
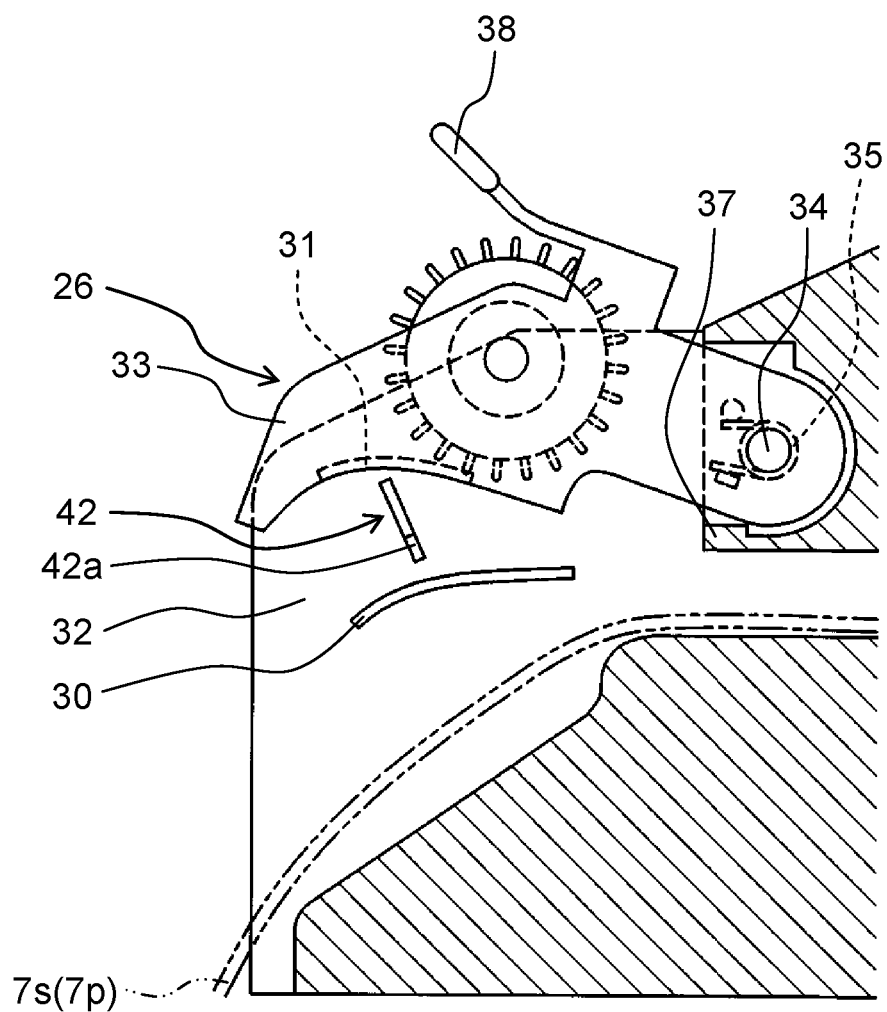
FIG. 6 is an explanatory view of a function of the following tape holder in the component supply device of the embodiment of the disclosure.

In FIGS. 5 and 6, the downstream side of movable member 33 is swingably connected to horizontal axis 34 having a horizontal rotation center of following tape 7s in the width direction. That is, movable member 33 is swingably formed in the upward and downward direction around horizontal axis 34. Coiled torsion spring 35 is installed in horizontal axis 34. One end of torsion spring 35 is connected to first spring retainer 36a fixed to base 6a and the other end of torsion spring 35 is connected to second spring retainer 36b fixed to movable member 33. As described above, movable member 33 is urged downward by torsion spring 35. In the embodiment, the upstream side of movable member 33 is urged downward by torsion spring 35, but a spring of another type such as a tension spring may be used instead of torsion spring 35.

Stopper 37, which restricts a downward displacement of movable member 33 as an upper surface abuts against a lower surface of movable member 33 to position second supporter 31 formed in movable member 33 at a same height as first supporter 30, is formed in base 6a. That is, following tape holder 26 includes a spring (torsion spring 35) that urges the upstream side of movable member 33 downward, and stopper 37 that positions second supporter 31 at the same height as first supporter 30 by restricting the downward displacement of movable member 33.

Operator 38 including a lever for the worker to operate with a finger is formed on an upper portion of movable member 33. The worker lifts operator 38 upward, so that the upstream side of movable member 33 can be lifted upward (see FIG. 6). As described above, movable member 33 can be displaced in the upward and downward direction with respect to fixed plate member 32 (see FIGS. 9A to 9D).

In FIG. 7, rotation shaft 39 having a horizontal rotation center oriented in the width direction of following tape 7s is fixed to movable member 33.

Third sprocket 41 is disposed in rotation shaft 39 via one-way clutch 40. A plurality of pins 41a are provided at positions on the left side (that is, on a side close to plate member 32) of an outer peripheral surface of third sprocket 41. Pin 41a of third sprocket 41 engages with feed hole 7h formed in following tape 7s of which the lower surface is supported by first supporter 30 and second supporter 31 in a state where movable member 33 abuts against stopper 37.

That is, first supporter 30 supports a side portion of following tape 7s on a side on which feed hole 7h is formed from below. Third sprocket 41, which is installed in horizontal rotation shaft 39 via one-way clutch 40, configures a locking portion that locks following tape 7s to first supporter 30 by engaging with feed hole 7h of following tape 7s.

One-way clutch 40 allows the rotation of third sprocket 41 and does not allow a reverse rotation thereof when following tape 7s engaging with third sprocket 41 moves on following tape holder 26 in the direction of insertion port 20a. Therefore, it is possible to prevent following tape 7s from falling from tape feeder 6. As described above, third sprocket 41, which is installed in horizontal rotation shaft 39 via one-way clutch 40, is installed movable member 33.

In FIGS. 6 and 7, protrusion 42 protruding upward first supporter 30 is formed at a position spaced upward from first supporter 30 on the right side surface of plate member 32. Taper 42a, which has an inclined surface (inclined surface separating from the right side surface of plate member 32 upward) that approaches the right side surface of plate member 32 downward, is formed at a lower end portion of protrusion 42. That is, a width of the lower end portion of protrusion 42 decreases in the horizontal direction as it goes downward.

Figure 4:
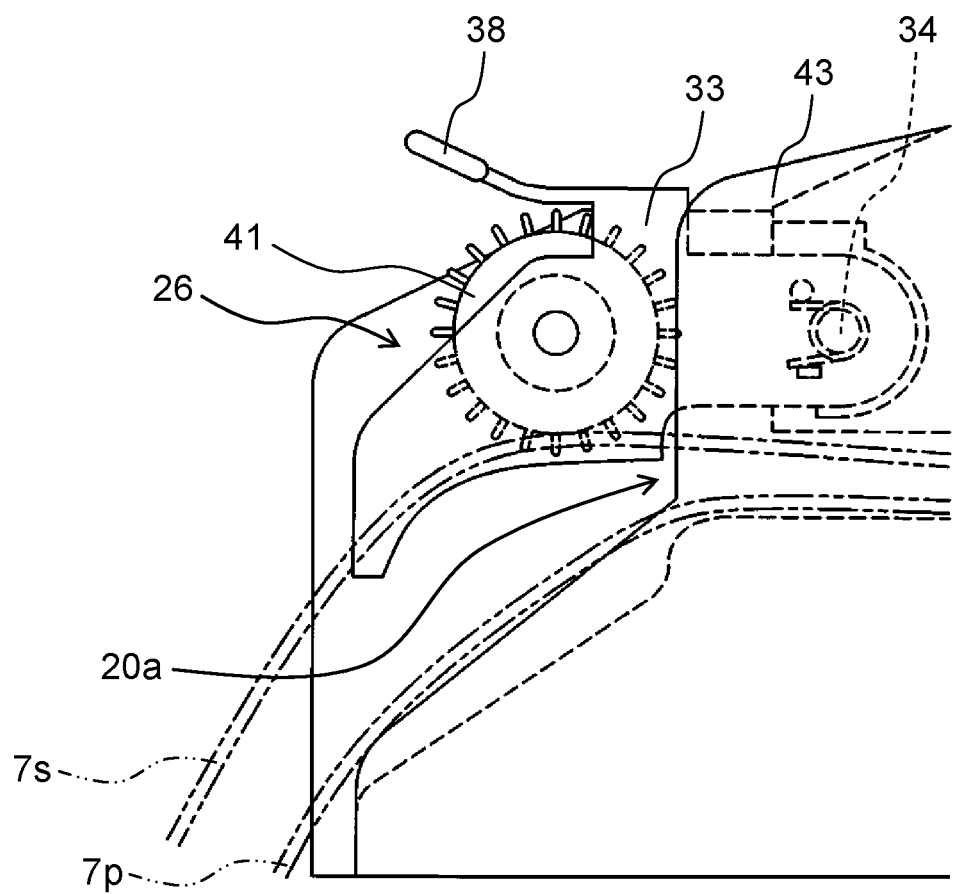
FIG. 4 is an explanatory view of a configuration of a following tape holder in the component supply device of the embodiment of the disclosure.

In FIG. 8, a position of a downstream end portion of second supporter 31 is on the upstream side of the position of the downstream end portion of first supporter 30. In addition, notch 31a, which has an inclined surface of which a side surface approaches the right side surface of movable member 33 as it goes to the downstream side, is formed on the downstream side of second supporter 31. That is, a width of one end portion of second supporter 31 in the horizontal direction on an insertion port 20a side (downstream side) decreases as it goes to the insertion port 20a side. In FIGS. 4 and 7, side cover 43, which is fixed to base 6a, is provided on the right side of movable member 33, and covers a periphery of horizontal axis 34.

Figure 9A:
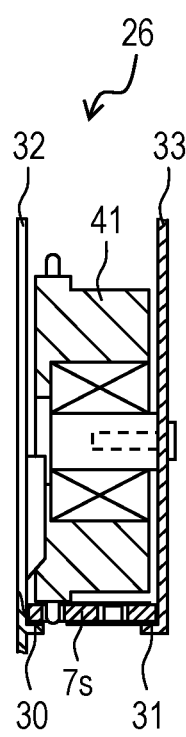
FIG. 9A is an explanatory view of the function of the following tape holder in the component supply device of the embodiment of the disclosure.

Next, a function of detaching an uninserted portion of following tape 7s from following tape holder 26 will be described with reference to FIGS. 9A to 9D. In FIG. 9A, in a state where movable member 33 abuts against stopper 37 and second supporter 31 is positioned at the same height as first supporter 30, following tape 7s is held by following tape holder 26. When the uninserted portion of following tape 7s is detached from following tape holder 26, the worker holds and lifts operator 38 upward. Therefore, movable member 33 ascends integrally with second supporter 31 and third sprocket 41.

Figure 9B:
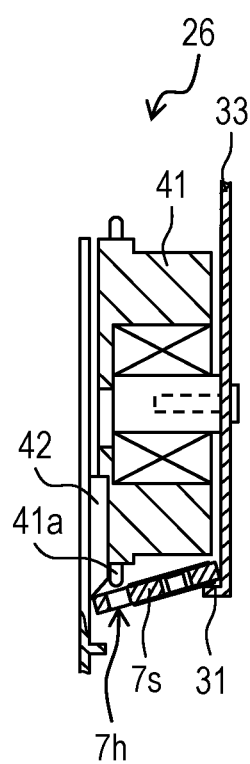
FIG. 9B is an explanatory view of the function of the following tape holder in the component supply device of the embodiment of the disclosure.
Figure 9C:
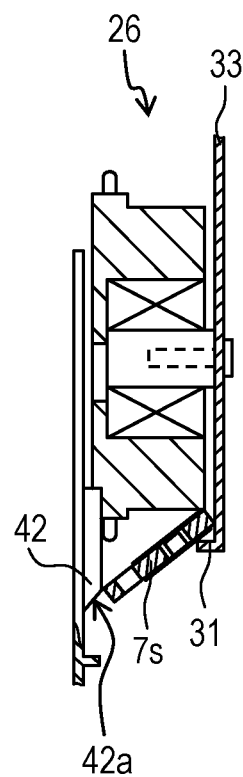
FIG. 9C is an explanatory view of the function of the following tape holder in the component supply device of the embodiment of the disclosure.

In FIG. 9B, as movable member 33 ascends, following tape 7s moves upward while the lower surface of following tape 7s on the right side is supported by second supporter 31, and the left side of following tape 7s abuts against protrusion 42. When movable member 33 further ascends, pin 41a of third sprocket 41 is disengaged from feed hole 7h of following tape 7s. In FIG. 9C, when following tape 7s further ascends together with movable member 33, following tape 7s is pressed by taper 42a of protrusion 42, is displaced to a position (right side) not overlapping with first supporter 30, and is twisted in a counterclockwise direction.

Figure 9D:
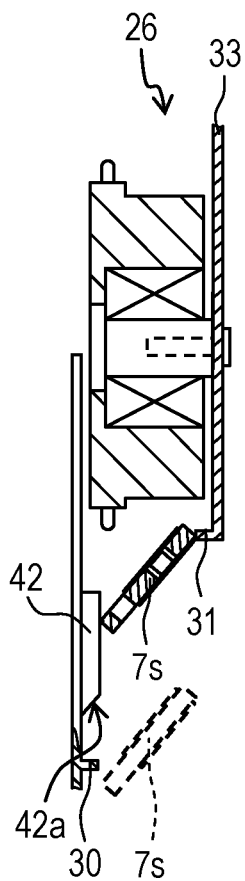
FIG. 9D is an explanatory view of the function of the following tape holder in the component supply device of the embodiment of the disclosure.

In FIG. 9D, when movable member 33 further ascends, the twist of following tape 7s increases, and the right end portion of following tape 7s eventually falls off from second supporter 31. In this case, the right end portion of following tape 7s surely falls off from notch 31a of second supporter 31 on the downstream side. In addition, since the left end portion of following tape 7s is displaced to the right side by protrusion 42, following tape 7s falls downward without being caught by first supporter 30 (indicated by a dotted line in the drawing).

Following tape 7s detached from following tape holder 26 moves to a position of a lower stage where leading tape 7p previously existed (see FIG. 6). The detachment of the uninserted portion of following tape 7s from following tape holder 26 is executed before next carrier tape 7 is inserted after the component supply from leading tape 7p is completed. When following tape 7s (next leading tape 7p) is detached, carrier tape 7 (next following tape 7s) is inserted into following tape holder 26.

That is, movable member 33, in which the guide surface for guiding the side surface on the other side of following tape 7s in the width direction and second supporter 31 are formed, and which is displaceable with respect to plate member 32 in the upward and downward direction, constitutes a detaching portion for detaching and causing the uninserted portion of following tape 7s to fall from following tape holder 26. The detaching portion displaces the position of second supporter 31 with respect to first supporter 30 upward and detaches the uninserted portion of following tape 7s from following tape holder 26. In addition, in the detaching portion, the locking portion (third sprocket 41) is installed in movable member 33 and the detaching portion and the locking portion are moved away from first supporter 30 together with second supporter 31.

As described above, tape feeder 6 has tape guideway 20, first tape feed mechanism 21, second tape feed mechanism 23, first supporter 30 that supports one side portion of the uninserted portion of following tape 7s in the width direction from below, and second supporter 31 which supports the side portion of the other side, and includes following tape holder 26 which holds the uninserted portion of leading tape 7p at a position spaced apart upward from the uninserted portion of leading tape 7p, and the detaching portion (movable member 33) which detaches and causes the uninserted portion of following tape 7s to fall from following tape holder 26 by displacing the position of second supporter 31 with respect to first supporter 30 upward. At least one end portion of second supporter 31 on the insertion port 20a side has a narrow width in the horizontal direction as it goes to the insertion port 20a side. Therefore, it is possible to efficiently replenish following tape 7s to tape feeder 6.

Figure 10:
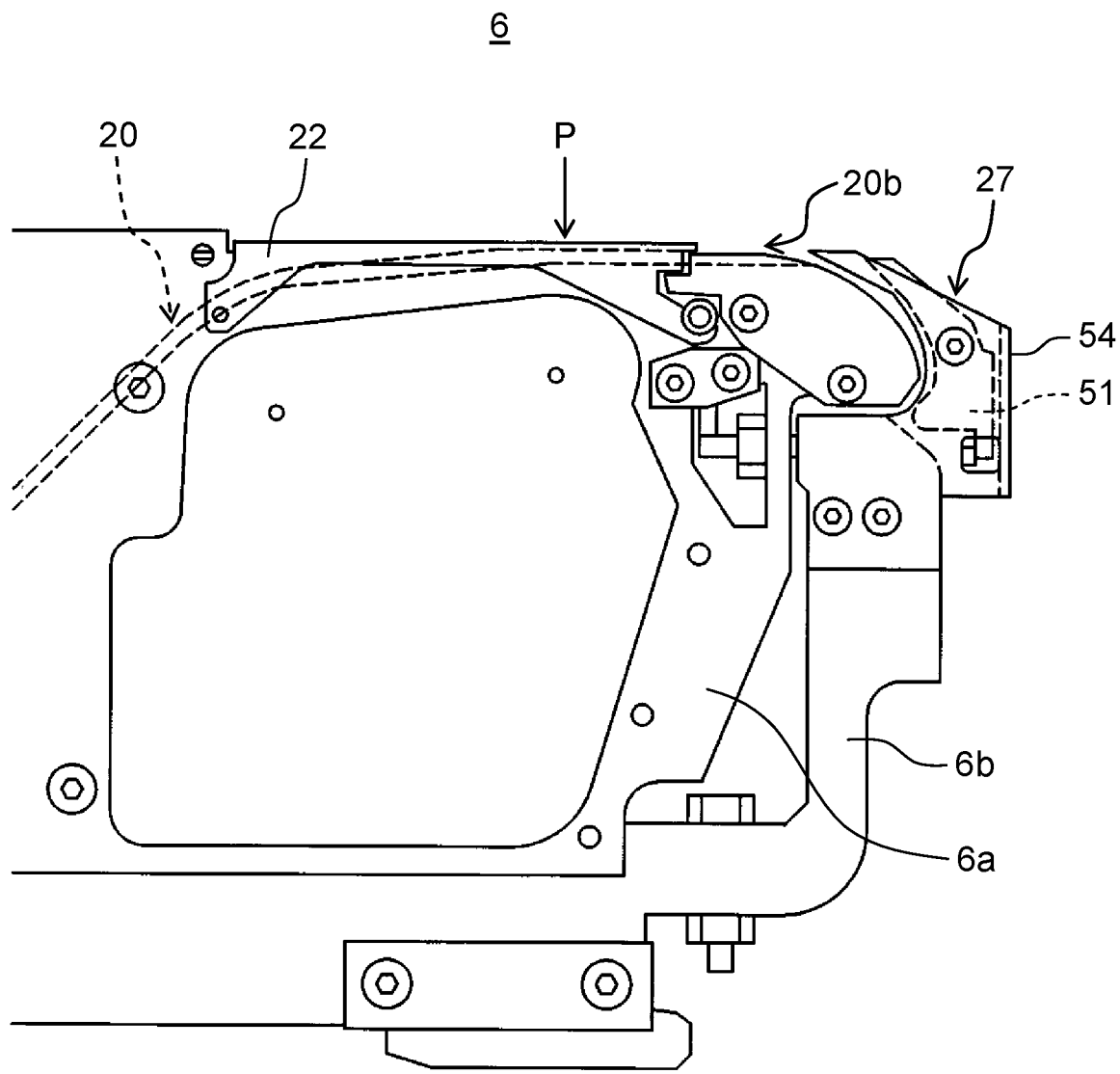
FIG. 10 is an explanatory view of a configuration of a curl corrector in the component supply device of the embodiment of the disclosure.
Figure 11:
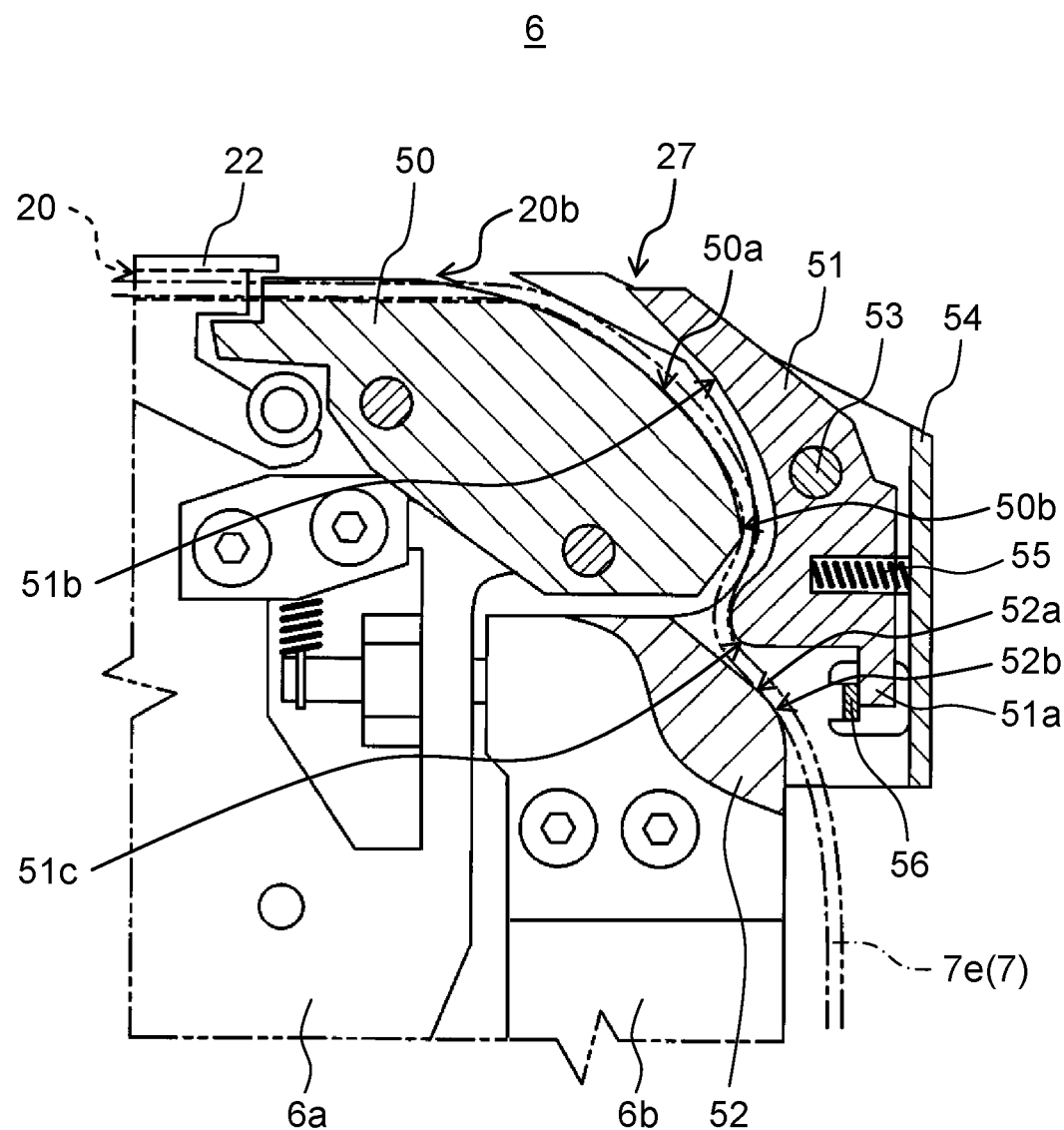
FIG. 11 is an explanatory view of a function of the curl corrector in the component supply device of the embodiment of the disclosure.

Next, the configuration and the function of curl corrector 27 will be described with reference to FIGS. 10 to 12. In FIGS. 10 and 11, curl corrector 27 has a function of correcting the curl caused in carrier tape 7 while guiding empty tape 7e, from which the component is picked up from discharge port 20b at component pick-up position P and which is discharged from discharge port 20b, to lower discharge chute 13, and while storing carrier tape 7 in reel 8. In FIG. 10, attachment 6b is installed on the lower surface of base 6a. The downstream side of attachment 6b rises along the downstream side of base 6a.

In FIG. 11, curl corrector 27 is constituted to include first member 50, second member 51, and third member 52, and a guide path for guiding empty tape 7e to discharge chute 13 is formed by first member 50, second member 51, and third member 52. Third member 52 is the upper end portion of attachment 6b. First member 50 has first guide surface 50a which is fixed to base 6a of tape feeder 6, comes into contact with the lower surface of empty tape 7e discharged from discharge port 20b in the horizontal direction, and guides empty tape 7e downward. The lower surface of empty tape 7e directed downward while being guided by first guide surface 50a is detached from first guide surface 50a by first contact portion 50b formed in first guide surface 50a.

In FIGS. 10 and 11, front cover 54 is installed at an upper end portion of attachment 6b. Second member 51 is swingably installed in a space of an inside surrounded by front cover 54 by swing shaft 53 horizontal in the width direction of empty tape 7e. Second member 51 is urged in the clockwise direction by compression spring 55 that is an elastic body disposed between second member 51 and front cover 54. Protrusion 51a protruding downward is formed at a lower end portion of second member 51. Stop member 56 (stopper) for restricting swing of second member 51 in the clockwise direction by coming into contact with protrusion 51a is provided in front cover 54.

Second guide surface 51b, which comes into contact with the upper surface of empty tape 7e discharged from discharge port 20b in the horizontal direction and guides empty tape 7e downward, is provided on a side surface of second member 51 facing first member 50. First guide surface 50a and second guide surface 51b form the guide path for guiding empty tape 7e discharged from discharge port 20b downward. Second guide surface 51b has a smoothly curved surface which is curved toward a base 6a side as it goes downward. Second contact portion 51c, which is a lower portion of second member 51 and below a portion installed in swing shaft 53, is formed in second guide surface 51b. Second contact portion 51c comes into contact with the upper surface of empty tape 7e, which is detached from first contact portion 50b and moved downward, to press empty tape 7e toward the base 6a side.

In FIG. 11, third member 52 has third guide surface 52a which is positioned below first member 50 and comes into contact with the lower surface of empty tape 7e moved downward by detached from second contact portion 51c. Third guide surface 52a is inclined in a direction away from base 6a as it goes downward and causes empty tape 7e, which has passed through the guide path formed by first guide surface 50a and second guide surface 51b, to direct to a direction away from base 6a. Second guide surface 51b and third guide surface 52a form a guide path for guiding empty tape 7e, which is detached from second contact portion 51c, downward.

The lower surface of empty tape 7e directed downward while being guided by third guide surface 52a is detached from third guide surface 52a by third contact portion 52b formed by third guide surface 52a. Empty tape 7e detached from third contact portion 52b enters discharge chute 13, is cut to a predetermined length at cutter 14 located in the middle of discharge chute 13, and is collected in collection box 12.

As described above, the first member, the second member, and the third member form the guide path for guiding empty tape 7e, from which the component is picked up by component mounting apparatus 1 and which is discharged from discharge port 20b in the horizontal direction, downward to guide empty tape 7e to discharge chute 13. First contact portion 50b which comes into contact with the lower surface of empty tape 7e, second contact portion 51c which comes into contact with the upper surface of empty tape 7e, and third contact portion 52b which comes into contact with the lower surface of empty tape 7e are disposed in the guide path in the order that empty tape 7e passes in a line from above.

Curl corrector 27 has the movable member (second member 51) including second contact portion 51c as a part and the elastic body (compression spring 55) for urging the movable member to the upper surface of empty tape 7e, and second contact portion 51c is displaceable in a direction traversing a straight line connecting first contact portion 50b and third contact portion 52b. Therefore, curl corrector 27 corrects the curl of the empty tape by causing empty tape 7e passing through the guide path to be curved by first contact portion 50b, second contact portion 51c, and third contact portion 52b in a direction in which the upper surface thereof is recessed.

Empty tape 7e with the curl is curled and caught in the inside of discharge chute 13 and may stay in the middle of discharge chute 13. However, empty tape 7e can be smoothly collected without being caught in discharge chute 13 by correcting the curl by curl corrector 27.

Figure 12:
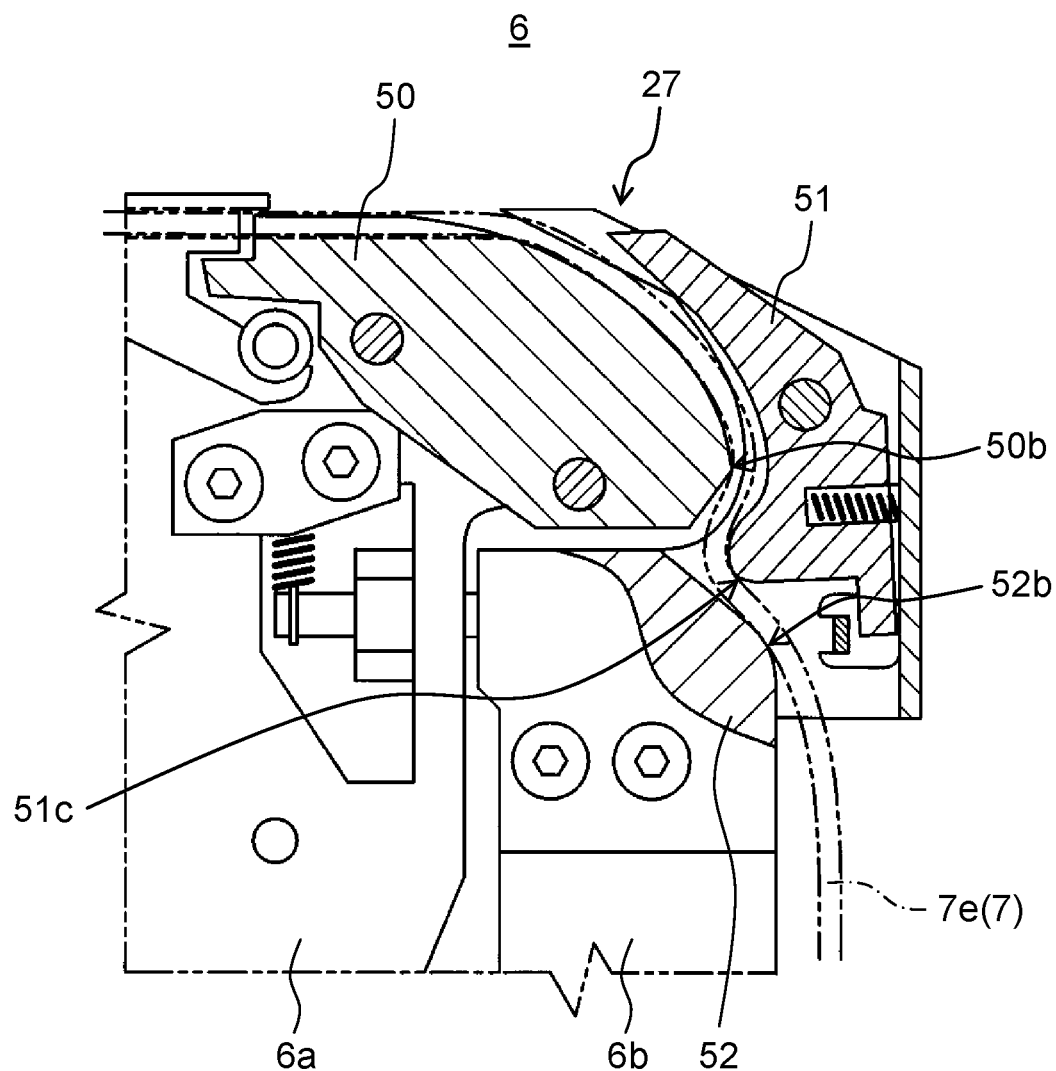
FIG. 12 is an explanatory view of the function of the curl corrector in the component supply device of the embodiment of the disclosure.

FIG. 12 illustrates an example in which empty tape 7e (carrier tape 7) thicker than that of FIG. 11 is discharged from discharge port 20b and is introduced into curl corrector 27. When thick empty tape 7e passes through second contact portion 51c, second member 51 is pressed by the upper surface of thick empty tape 7e and is displaced in a direction away from base 6a. That is, second contact portion 51c can correct the curl by applying an appropriate force that causes empty tape 7e to be curved in a direction in which empty tape 7e is recessed by being displaced according to the thickness of empty tape 7e.

As described above, tape feeder 6 (component supply device) for supplying the component stored in carrier tape 7 to component mounting apparatus 1 includes curl corrector 27 which corrects the curl of empty tape 7e that is carrier tape 7 from which the component is picked up by component mounting apparatus 1. Therefore, it is possible to smoothly collect even carrier tape 7 having large curl.

Moreover, curl corrector 27, which is described above, is configured integrally with attachment 6b which is installed in base 6a, but curl corrector 27 is not limited to the configuration. That is, curl corrector 27 may be located at a position between component pick-up position P and cutter 14 so as to guide empty tape 7e discharged from discharge port 20b in the horizontal direction to lower discharge chute 13. Moreover, curl corrector 27 may be disposed in a tape feeder of a type in which following tape 7s is joined to leading tape 7p with a splicing tape and replenished.

Figure 13:
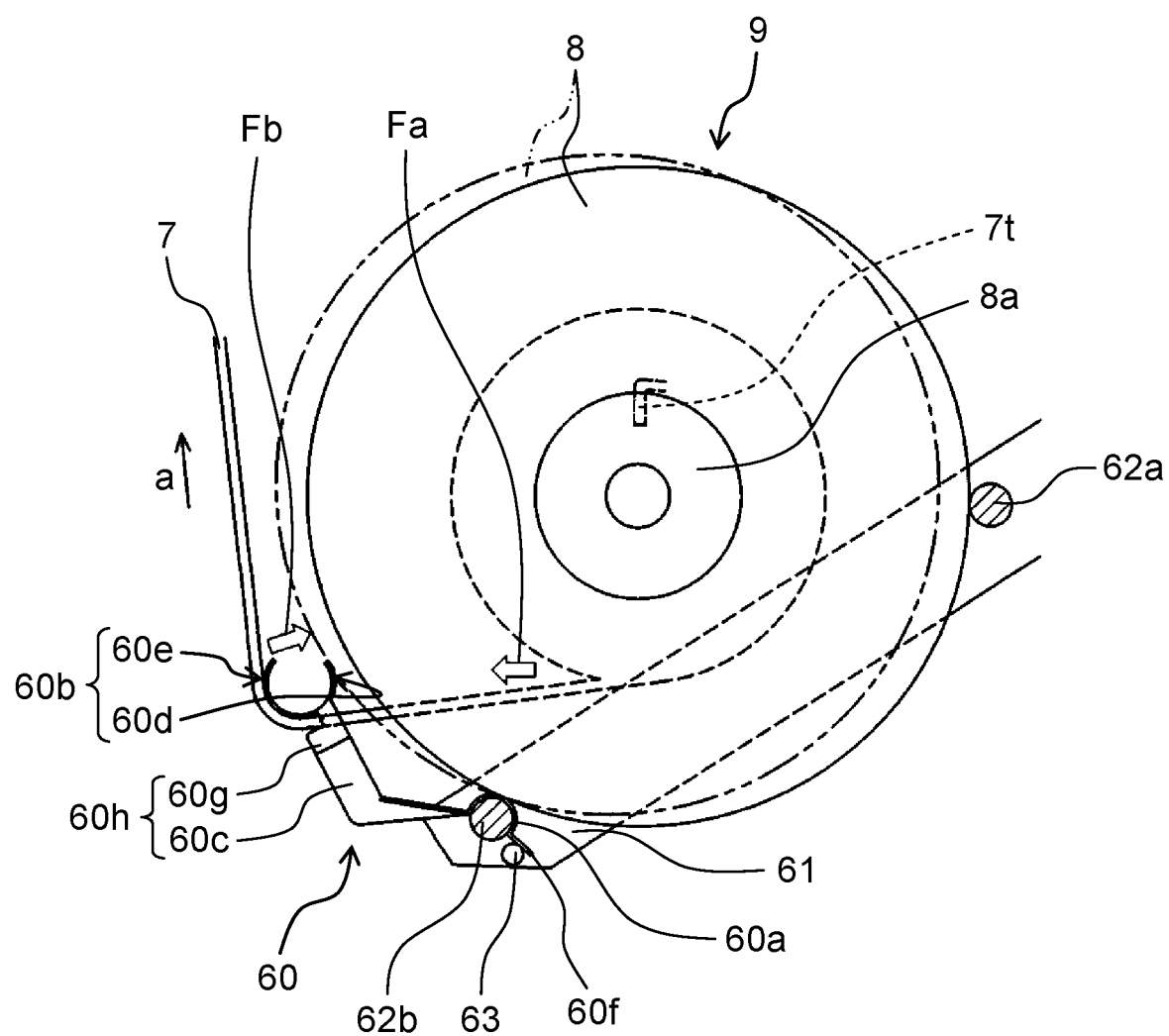
FIG. 13 is an explanatory view of a configuration of a reel holder in a reel holding apparatus of the embodiment of the disclosure.

Next, configurations and functions of reel holder 9 for holding reel 8 included in carriage 5 and reel pressing member 60 for preventing reel 8 installed in reel holder 9 from falling will be described with reference to FIGS. 13 and 14. In FIG. 13, carrier tape 7, of which terminal portion 7t is inserted into a part of an outer peripheral surface of reel core 8a, is wound and stored in reel 8. Terminal portion 7t of carrier tape 7 which is supplied to tape feeder 6 and is drawn out from reel 8 falls off from reel core 8a.

In FIG. 13, reel holder 9 includes a pair of reel guides 61 that sandwiches reel 8 from both sides, first reel supporter 62a and second reel supporter 62b that position between the pair of reel guides 61 and receive an outer periphery of reel 8 at two points. Among them, second reel supporter 62b that is positioned on a side (front side) in a direction in which carrier tape 7 is drawn out is provided at a position lower than first reel supporter 62a on a back side, and facilitates taking-in and taking-out of reel 8 to and from reel holder 9.

In FIG. 13, reel pressing member 60 includes connecting portion 60a formed at one end portion thereof, tape guide portion 60b formed the other end portion, plate-shaped coupling portion 60c for coupling connecting portion 60a and tape guide portion 60b. Reel abutting surface 60d and tape guide surface 60e are formed in tape guide portion 60b. Connecting portion 60a engages with second reel supporter 62b between the pair of reel guides 61 in a detachable state. Therefore, reel pressing member 60 is installed in reel holder 9 in a detachable state. In addition, reel pressing member 60 installed in reel holder 9 is swingable around second reel supporter 62b.

Reel abutting surface 60d is a curved surface and is formed on a surface of tape guide portion 60b on the reel 8 side in a state where reel pressing member 60 is installed in second reel supporter 62b. Tape guide surface 60e is a curved surface and is formed on a surface of tape guide portion 60*b* on a side opposite to the reel 8 in a state where reel pressing member 60 is installed in second reel supporter 62*b*. Tape guide surface 60*e* guides carrier tape 7 which is drawn out from reel 8 held by reel holder 9 toward tape feeder 6 disposed above reel holder 9. Therefore, carrier tape 7 which is drawn out from reel 8 held by reel holder 9 passes between connecting portion 60*a* and tape guide portion 60*b*, changes a course upward, and directs toward tape feeder 6 while bringing a back surface thereof along tape guide surface 60*e*.

In FIG. 13, when carrier tape 7 drawn out from reel 8 is drawn into tape feeder 6 (arrow a), force Fa is applied to reel 8 held by reel holder 9 in a direction in which carrier tape 7 is drawn out. In addition, force Fb for rotating in the clockwise direction by the tension of carrier tape 7 is applied to reel pressing member 60.

Rotation stopper 63, which abuts against end portion 60*f* of reel pressing member 60 and restricts a position where tape guide portion 60*b* approaches reel 8, is provided in reel guide 61. Therefore, tape guide portion 60*b* does not come into contact with reel 8 and prevents reel 8 rotating due to the drawing-out of carrier tape 7 and tape guide portion 60*b* from rubbing and producing dust. Moreover, rotation stopper 63 may have any shape as long as it can engage with reel pressing member 60, and for example, may be a hole with which a protrusion formed in end portion 60*f* of reel pressing member 60 engages and which is formed in reel guide 61.

Figure 14:
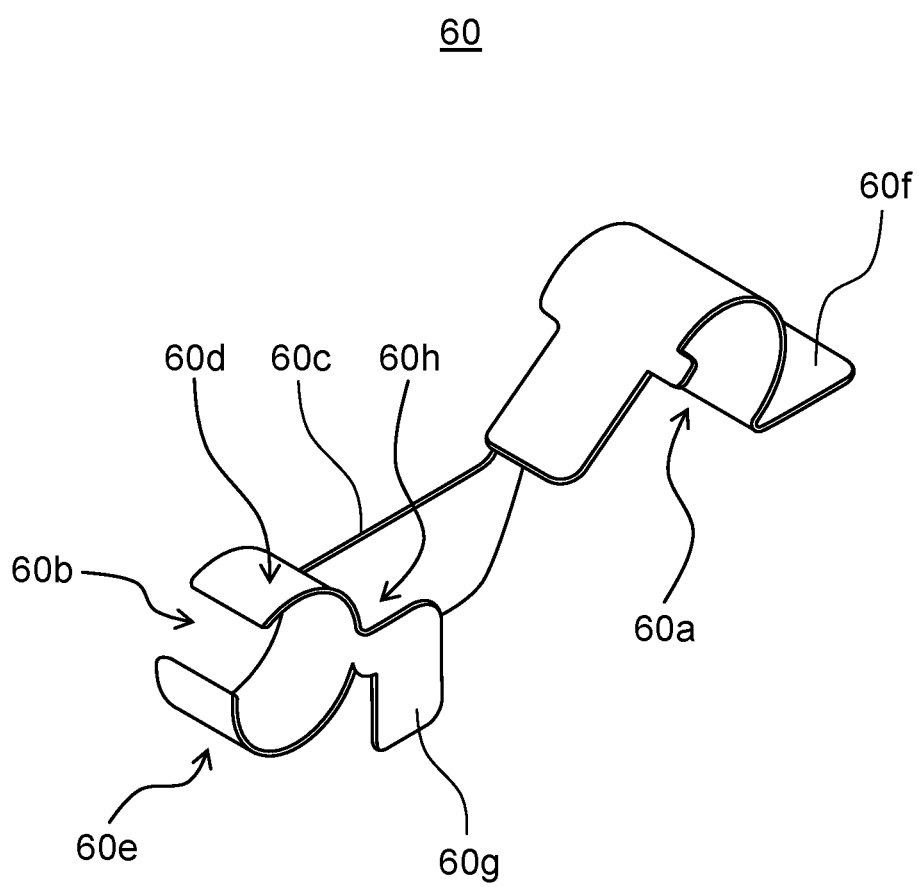
FIG. 14 is an explanatory view of a configuration of a reel pressing member installed in the reel holder in the reel holding apparatus of the embodiment of the disclosure.

In FIGS. 13 and 14, plate-shaped side plate 60*g* is provided at a position facing a side surface of coupling portion 60*c* in tape guide portion 60*b*. The movement of carrier tape 7, which is drawn out from reel 8 and is supplied to tape feeder 6, is restricted in the width direction on the side surface of coupling portion 60*c* and the side surface of side plate 60*g*, and is fed to tape guide surface 60*e* without falling from reel pressing member 60. That is, coupling portion 60*c* and side plate 60*g* constitute falling prevention portion 60*h* for preventing carrier tape 7 from falling from tape guide surface 60*e*.

When carrier tape 7 is drawn out by tape feeder 6, a weight of reel 8 is reduced, reel 8 may be pulled out by carrier tape 7 from which reel 8 is drawn out to ride over second reel supporter 62*b*. However, reel 8 which rides over second reel supporter 62*b* abuts against reel abutting surface 60*d* of tape guide portion 60*b*, and the movement thereof is blocked at a position indicated by a two-dotted chain line in FIG. 13. Therefore, reel 8 is prevented from falling from reel holder 9.

When carrier tape 7 is drawn out, terminal portion 7*t* is exposed, and tape feeder 6 pulls carrier tape 7, terminal portion 7*t* is pulled out from reel core 8*a*. Also in this case, reel 8 is pulled by carrier tape 7 and rides over second reel supporter 62*b*, but the movement thereof is blocked at the position indicated by the two-dotted chain line in FIG. 13 by reel abutting surface 60*d*, and reel 8 is prevented from falling from reel holder 9.

As described above, carriage 5 holding reel 8, around which carrier tape 7 storing the component supplied to component mounting apparatus 1 is wound, is the reel holding apparatus including reel holder 9 which rotatably supports reel 8, and tape guide portion 60*b* which is connected to reel holder 9, is capable of abutting against the outer periphery of reel 8, and abuts against the back surface of carrier tape 7. Therefore, it is possible to prevent the falling-off of reel 8 at low cost. In addition, terminal portion 7*t* of carrier tape 7 can be reliably pulled out from reel core 8*a* by blocking the movement of reel 8 by tape guide portion 60*b*.

Figure 15:
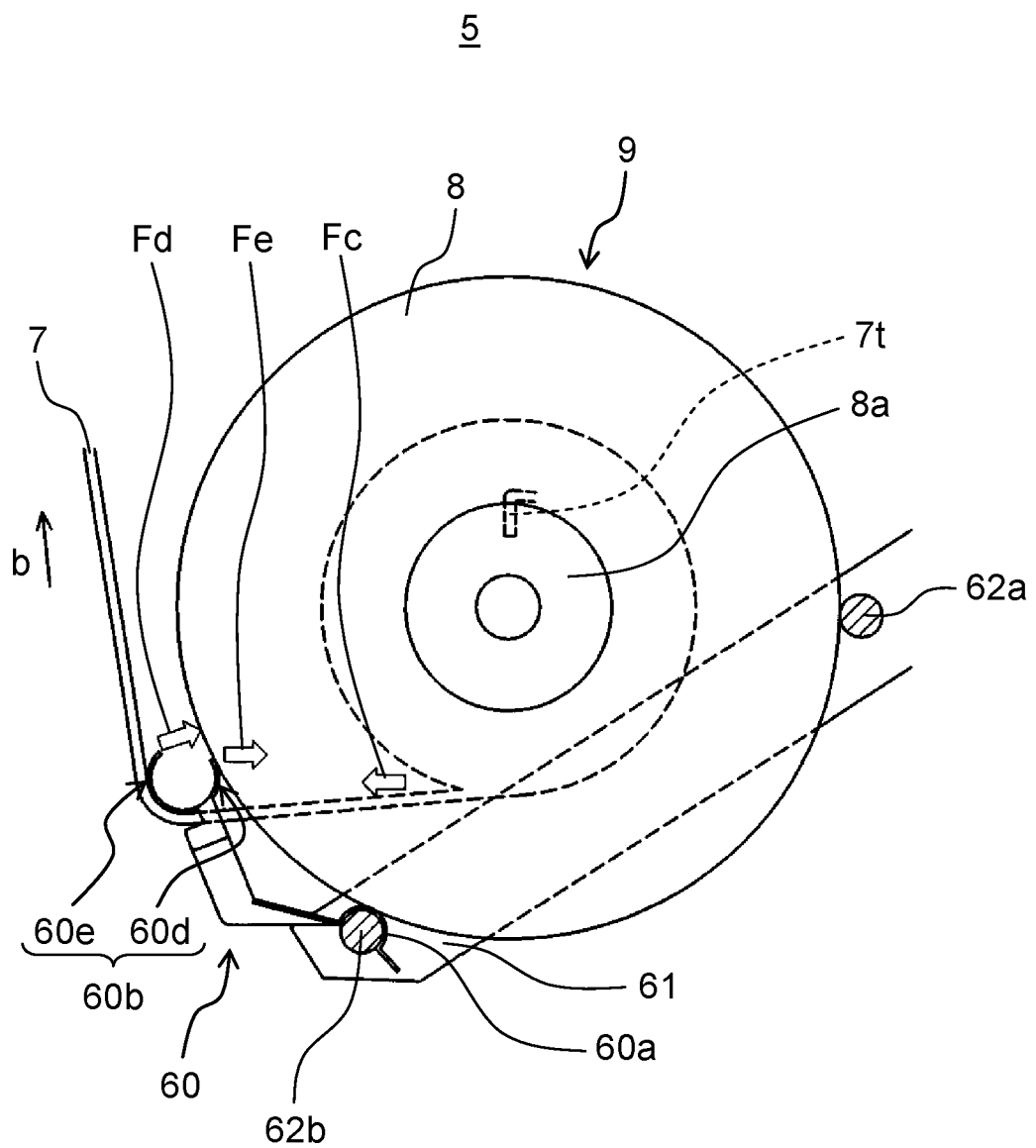
FIG. 15 is an explanatory view of a configuration of another reel holder in the reel holding apparatus of the embodiment of the disclosure.

Next, another example of the reel holding apparatus (carriage 5) having tape guide portion 60*b* will be described with reference to FIG. 15. The other example is different from the example illustrated in FIG. 13 in that rotation stopper 63 is not provided in reel guide 61. That is, in a case where reel pressing member 60 is rotated, the stop position is not restricted. In FIG. 15, when carrier tape 7 drawn out from reel 8 is drawn into tape feeder 6 (arrow b), force Fc is applied to reel 8 held by reel holder 9 in a direction in which carrier tape 7 is drawn out.

Force Fd for rotating tape guide portion 60*b* to the reel 8 side is applied to reel pressing member 60, tape guide portion 60*b* is rotated, reel abutting surface 60*d* abuts against the outer periphery of reel 8, and force Fe for pressing reel 8 to reel holder 9 is generated.

Therefore, it is possible to prevent the falling-off of reel 8. In addition, terminal portion 7*t* of carrier tape 7 can be pulled out from reel core 8*a* by blocking the movement of reel 8 by tape guide portion 60*b*.

The component supply device of the present disclosure has an effect that can smoothly collect even a carrier tape having large curl and is useful in a field of mounting a component on a board.

What is claimed is:

1. A component supply device that supplies a component stored in a carrier tape to a component mounting apparatus, the component supply device comprising:
   a curl corrector that corrects curl of an empty tape which is the carrier tape from which the component is picked up by the component mounting apparatus.

2. The component supply device of claim 1,
   wherein the curl corrector includes a guide path for guiding the empty tape to a discharge chute,
   wherein the guide path includes a first contact portion that comes into contact with a lower surface of the empty tape, a second contact portion that comes into contact with an upper surface of the empty tape, and a third contact portion that comes into contact with the lower surface of the empty tape, and
   wherein the first contact portion, the second contact portion, and the third contact portion are disposed in order in which the empty tape passes, and bend the empty tape so that the upper surface of the empty tape is recessed.

3. The component supply device of claim 2,
   wherein the guide path is directed in a direction of guiding the empty tape downward, and
   wherein the first contact portion, the second contact portion, and the third contact portion are arranged in this order from above.

4. The component supply device of claim 2,
   wherein the second contact portion is displaceable in a direction traversing a straight line connecting the first contact portion and the third contact portion.

5. The component supply device of claim 4, further comprising:
   a movable member including the second contact portion; and
   an elastic body urging the movable member to the upper surface of the empty tape.

* * * * *